(12) United States Patent
Ward

(10) Patent No.: US 7,872,443 B2
(45) Date of Patent: Jan. 18, 2011

(54) CURRENT LIMITING PARALLEL BATTERY CHARGING SYSTEM TO ENABLE PLUG-IN OR SOLAR POWER TO SUPPLEMENT REGENERATIVE BRAKING IN HYBRID OR ELECTRIC VEHICLE

(76) Inventor: Thomas A. Ward, 1146 Larch Ave., Moraga, CA (US) 94556

( * ) Notice: Subject to any disclaimer, the term of this patent is extended or adjusted under 35 U.S.C. 154(b) by 655 days.

(21) Appl. No.: 11/877,509

(22) Filed: Oct. 23, 2007

(65) Prior Publication Data

US 2008/0203966 A1 Aug. 28, 2008

Related U.S. Application Data

(60) Provisional application No. 60/956,647, filed on Aug. 17, 2007, provisional application No. 60/891,356, filed on Feb. 23, 2007.

(51) Int. Cl.
*H02J 7/14* (2006.01)
(52) U.S. Cl. .................. 320/104; 320/103; 903/907
(58) Field of Classification Search .............. 320/104; 903/907
See application file for complete search history.

(56) References Cited

U.S. PATENT DOCUMENTS

| | | | |
|---|---|---|---|
| 4,282,475 A * | 8/1981 | Milton | 320/138 |
| 4,489,242 A | 12/1984 | Worst | |
| 5,701,597 A * | 12/1997 | Nakanishi et al. | 455/127.1 |
| 2002/0171390 A1 | 11/2002 | Kruger et al. | |
| 2005/0046381 A1 * | 3/2005 | George et al. | 320/105 |

FOREIGN PATENT DOCUMENTS

| | | |
|---|---|---|
| JP | 2004221521 | 5/2004 |
| WO | WO 2007/025096 A1 | 3/2007 |

OTHER PUBLICATIONS

Green Car Congress, Solar-Power-Augmented Prius Takes the Grid Out of "Plug-In", Aug. 15, 2005, http://www.greencarcongress.com/2005/08/solarpoweraugme.html, pp. 1-2.
"Current limiting," from Wikipedia, http://en.wikipedia.org/wiki/Current_limiting, last modified Oct. 17, 2007, pp. 1-2.
Yahoo! Auto Groups, Priusplus. PRIUS+ Plug-In Hybrid Conversion Group, blog posted Jan. 20, 2005, http://autos.groups.yahoo.com/group/priusplus/post "Re: Another Prius +: a whole new possibility".

* cited by examiner

*Primary Examiner*—Edward Tso
*Assistant Examiner*—M'Baye Diao
(74) *Attorney, Agent, or Firm*—Fliesler Meyer LLP

(57) ABSTRACT

To provide additional charge storage for an electric vehicle, an additional battery (100) is connected in parallel with a regenerative braking direct charged battery (22) through a current limiting circuit (104 or 120). The additional battery (100) is charged by an external charger such as a plug-in charger or a solar panel that supply minimal current to prevent generation of battery heat. Current flows from the additional battery (100) to the regenerative braking charged batteries (22) so that both batteries can be charged. However, when excessive charge is drawn to drive the vehicle electric motor (20), the current limiter circuit (104 or 120) serves to prevent the discharge of additional battery (100) from creating excessive heat in the additional battery (100). Further, when regenerative braking is applied the current limiter circuit (120), or a diode buffer (102) in combination with current limiter (104), serves to prevent charging from creating excessive heat in the additional battery (100) and eliminates the need for a cooling structure in the additional battery (100).

14 Claims, 10 Drawing Sheets

CURRENT LIMITING PARALLEL BATTERY CHARGING SYSTEM TO ENABLE PLUG-IN OR SOLAR POWER TO SUPPLEMENT REGENERATIVE BRAKING IN HYBRID OR ELECTRIC VEHICLE

CLAIM FOR PRIORITY TO PROVISIONAL APPLICATION

The present application claims priority to provisional patent application Ser. No. 60/956,647 filed Aug. 17, 2007 entitled "Hybrid Vehicle With Adjustable Solar Panel, Telescoping Additional Solar Panels, And Current Limiting Parallel Battery Charging System To Supplement Regenerative Braking." The present application further claims priority to provisional patent application Ser. No. 60/891,356 filed Feb. 23, 2007 entitled "Hybrid Vehicle With Angle Adjustable Solar Panel and Parallel Battery Charging System To Supplement Regenerative Braking."

BACKGROUND

1. Technical Field

The present invention relates to a system for increasing the battery power available for an electric vehicle. More particularly, the present invention relates to a system for increasing available battery power when charging is available from a means that supplements regenerative braking.

2. Related Art

Electric vehicles or hybrid vehicles that are powered by a combination of electric and fueled motors include batteries that are typically charged by regenerative braking. Other sources of electric charge power can be provided to the electric powered vehicle to supplement regenerative braking. For example, the other sources can include a plug in charger that can be plugged into an AC wall outlet. A source of additional power can further include a solar panel.

These alternative charge current sources can supply current that exceeds the storage capacity typically provided in a vehicle that receives charge only from regenerative braking. With availability of an alternative current source for supplying charge to supplement regenerative braking, it can be desirable to increase the battery charge storage capability of the electric powered vehicle to store the added charge. It can be desirable to increase battery charge storage further when a longer than normal travel distance is desired and added battery weight is not a concern. For example, an electric vehicle may be designed to carry the weight of four passengers, but only one passenger desires to use the vehicle to travel a greater distance that a single battery charge will allow. The single user may desire to connect an additional battery to allow travel over the greater distance since the additional battery weight may no longer exceed the load carrying capacity of the vehicle. It would be desirable to provide a simple additional battery system for an electric vehicle that can be easily connected when the additional charge storage is desired by a user.

SUMMARY

Embodiments of the present invention provide a simple battery system that can be connected to an electric motor powered vehicle when additional battery charge is desired. The battery system is simplified by connecting an additional battery in parallel through a current limiter so that excessive charge from regenerative braking or operation of the electric motor does not dictate use of a complex cooling system in the additional battery.

Embodiments of the present invention are provided based on several recognitions. Initially, it is recognized that both regenerative braking and driving an electric motor require high currents that generate significant heat requiring a complex battery cooling system. Further it is recognized that charging of a battery with either solar power or a plug-in charger will not necessarily generate such heat. Finally based on these recognitions, it is further recognized that an additional battery structure without a complex cooling system can be used with the additional battery connected in parallel with the first battery if high current for regenerative braking or for powering the electric motor is not provided through the added system battery.

Vehicles that are driven by an electric motor, including hybrid vehicles, typically operate with a high voltage battery, some on the order of 300 volts or more. Solar cells that cover a vehicle, as well as a plug-in charger will typically produce significantly less than 300 volts. Further solar cells and plug-in charging systems also typically generate significantly less current than a regenerative braking system, or the charge that is provided to drive a high voltage motor. Accordingly the solar cells or plug-in charging system can be used to charge a battery without requiring a complex battery cooling structure.

To enable the additional battery to provide charge to the regenerative braking direct charged battery, embodiments of the present invention connect the additional battery in parallel through a current limiting circuit. The additional battery is charged by a device such as a plug-in AC wall charger or a solar panel that generates minimal current to prevent generation of heat. Current flows from the additional battery to the regenerative braking charged battery so that both batteries can be charged. However, when regenerative braking is applied, or charge is drawn to drive the vehicle electric motor, the current limiter circuit serves to prevent the charge or discharge from creating excessive heat in the additional battery. With current limiting, cooling of the additional battery, necessary when charging directly by regenerative braking and discharging to run the electric vehicle motor from both batteries, will thus not be required.

The current limiter can be made from a first transistor and sensing resistor provided in the parallel connection between the batteries, along with a control circuit connected to clamp the current through the first transistor to a desired maximum value. With a CMOS first transistor used, a source-drain path of the first transistor can be connected between the parallel batteries, while the first transistor gate is connected to a control circuit that slowly turns off current-flow through the first transistor to clamp the current through the source-drain path to a desired maximum value. The control circuit in one embodiment is a second transistor with a gate-drain path connected across the sensing resistor to determine the current level provided between the two batteries. The source of the second transistor is connected to the gate of the first transistor. The control circuit in a second embodiment is a differential amplifier with inputs connected across the sensing resistor and an output connected to the gate of the first transistor.

In some embodiments a single directional current limiter is provided, while in other embodiments a bi-directional current limiter is used. If it is not desirable to charge the additional battery using regenerative braking, a single directional current limiter can be used in combination with a buffer that blocks current from regenerative braking. The single directional current limiter can include a single transistor connected between the parallel batteries as described above. If charging from regenerative braking is desirable, a bi-directional current limiter can be used. The bi-directional current limiter can include two current limiters as described above, one operating in each current direction between the parallel batteries.

BRIEF DESCRIPTION OF THE FIGURES

Further details of the present invention are explained with the help of the attached drawings in which.

DETAILED DESCRIPTION

I. Low Current Chargers

Embodiments of the present invention allow use of an additional parallel battery that can be charged by a low current charger while preventing overheating. Overheating of the additional battery can otherwise result due to charging by regenerative braking, or discharging when running an electric motor. The low voltage charger can, for example, be a solar panel as illustrated in FIG. 1, or a plug-in charging system as illustrated in FIG. 2.

Figure 1:
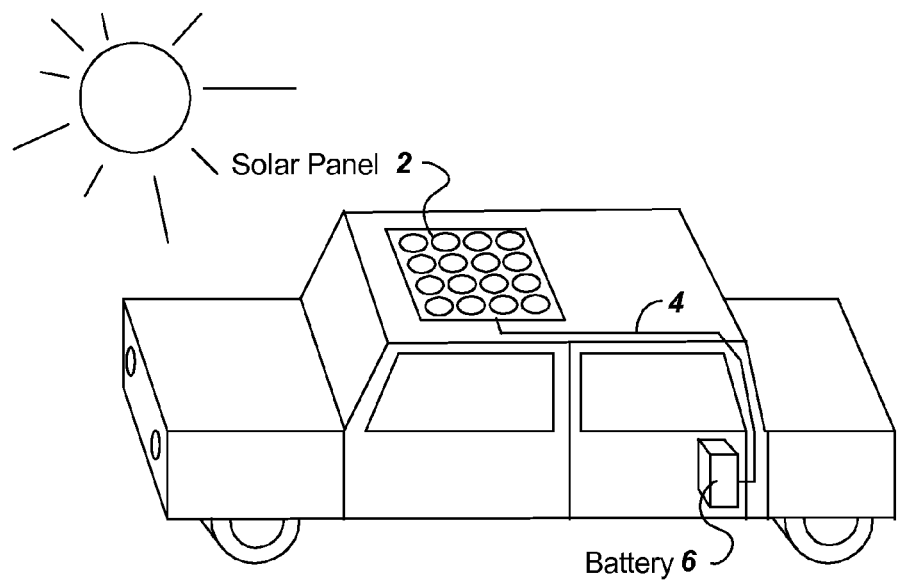
FIG. 1 shows a vehicle illustrating a solar panel battery charging system.

FIG. 1 shows a vehicle illustrating a solar panel battery charging system with a solar panel 2 placed on the roof to charge a battery 6 powering an electric motor of the vehicle. Although shown on the roof, it is understood that the solar panel 2 can be attached to a vehicle in a number of ways. Other non-limiting exemplary places to attach a solar panel 2 to a vehicle include providing the solar panel in a moon roof, attaching the solar panel to a roof rack, attaching the solar panel to the trunk or hood of the car, and providing the solar panel inside the car on a dashboard or sunshade. The solar panel 2 is shown connected through a line 4 to a battery 6 placed behind the rear seat of the car. The battery 6 is further connected to the electric motor of the vehicle, not shown. The vehicle electric motor provides regenerative braking to charge the battery 6, and the battery 6 serves to provide current to drive the vehicle electric motor. Although battery 6 is shown placed behind the rear seat, some manufacturers place the battery in alternative locations such as beneath a floorboard cover. Other components of a solar panel charging system are described subsequently with respect to FIG. 3.

Figure 2:
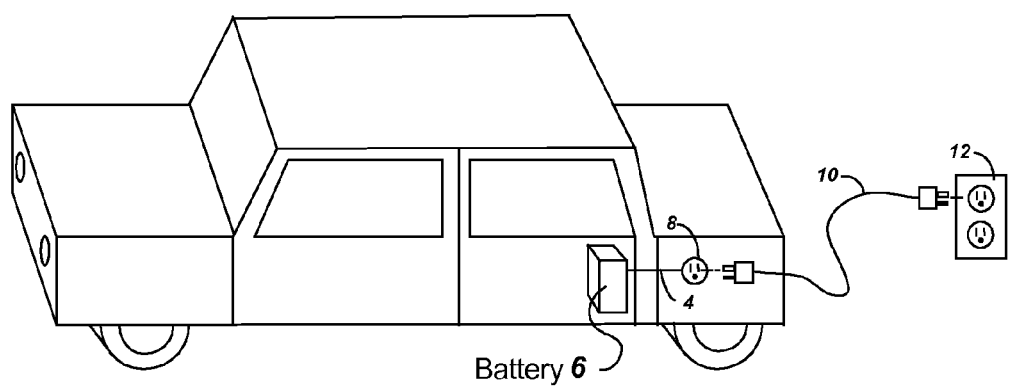
FIG. 2 shows a vehicle illustrating a plug-in battery charging system.

FIG. 2 shows a vehicle illustrating a plug-in battery charging system for charging a battery 6 powering an electric motor of a vehicle. The plug in charging system is shown with a plug connection 8 for connecting by a cord 10 to an AC wall plug in outlet 12. The plug in charging system is further connected through a line 4 to a battery 6 placed behind the rear seat of the car. As in FIG. 1, the battery is further connected to the electric motor of the vehicle, not shown. The vehicle electric motor then provides regenerative braking to charge the battery 6 and the battery 6 serves to provide current to drive the vehicle electric motor. Other components of a plug in charging system are described subsequently with respect to FIG. 3.

Embodiments of the present invention provide a system for using an additional battery charged by a low voltage charging system, where the low voltage charging system can be a solar panel as shown in FIG. 1 or a plug in charger as shown in FIG. 2. The charging system of embodiments of the present invention enable the additional battery to be a simple component that doesn't require a complex cooling system.

II. Battery Charging System Overview

Figure 3:
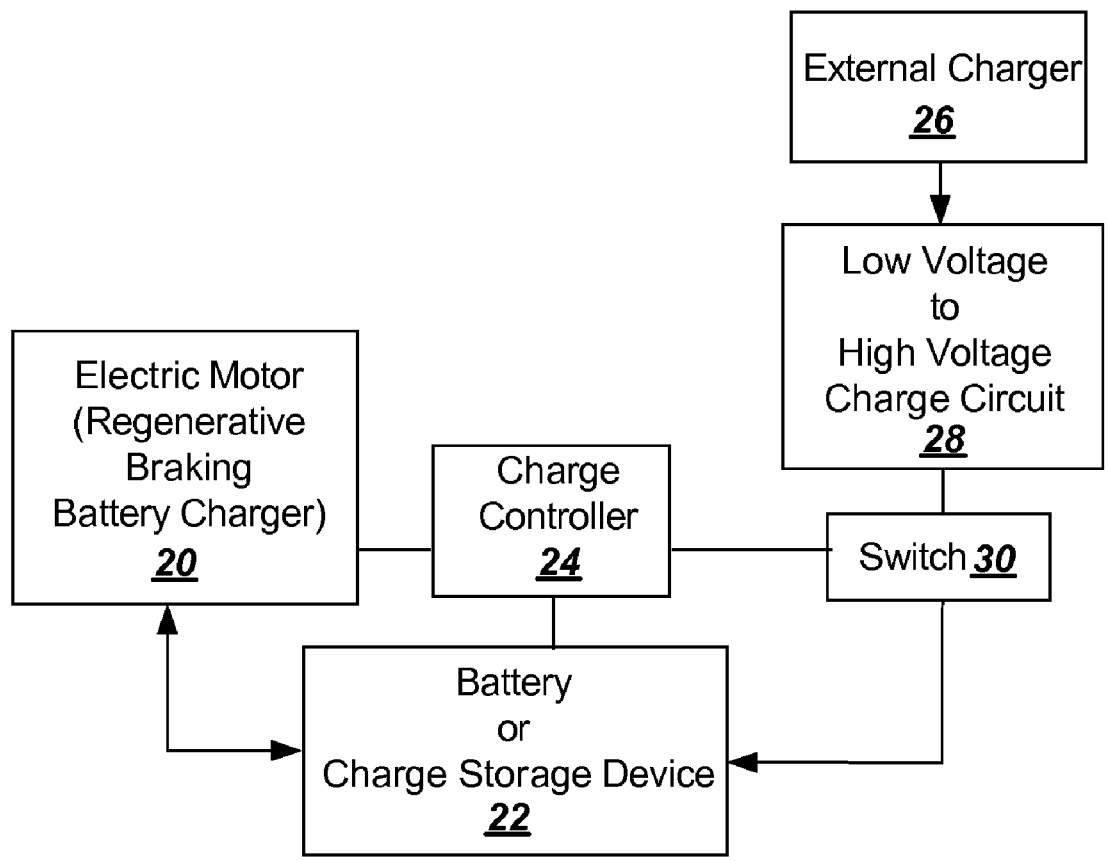
FIG. 3 shows a block diagram providing an overview of components of a battery charging system for an electric vehicle.

FIG. 3 shows a block diagram providing an overview of components of a battery charging system for an electric vehicle. The components include an electrical motor 20 for powering the vehicle that also provides for regenerative braking to charge battery 22. The charge controller 24 switches the motor 20 so that it can be used to drive the vehicle when battery power is sufficient, and then return to charging the batteries 22 when braking or deceleration of the vehicle occurs. The charge controller 24 can monitor charge in the battery 22 and provide a signal to a display to alert a vehicle operator of charge on the battery 22, among other things. The charge controller 24 can also control components in the battery 22, such as a cooling fan.

Additionally in FIG. 3, the system includes an external charger 26. An example of the external charger 26 includes a solar panel or a plug-in charger. A low voltage to high voltage charge circuit 28 connects the external charger 26 to the battery 22 through switch 30. The switch 30 can be included to cut off charging to prevent overcharge of the battery 22, or to prevent damage to the high to low voltage charge circuit 28 when the electric motor 20 is operating. In some embodiments, with sufficient voltage from the external charger 26, the high voltage to low voltage charge circuit 28 can be eliminated. Further, in some embodiments, such as when overcharge of the battery 22 or damage to the high to low voltage charge circuit 28 is not a concern, the switch 30 can be eliminated.

The charge controller 24 can be one or more devices such as a processor, an application specific circuit, a programmable logic device, a digital signal processor, or other circuit programmed to perform the functions described to follow. Initially, the charge controller 24 can control application of regenerative braking by appropriately configuring the electric motor 20 to charge the battery 22. The charge controller 24 can further operate the electric motor 20 as an electric motor that discharges battery 22. The charge controller 24 can further control switch 30 to close to allow the external charger 26 to connect to charge the battery 22, or to disconnect the switch 30 to prevent overcharge of the battery or to prevent damage to the low to high voltage charge circuit 28 or external charger 26. The charge controller 24 can further control the low voltage to high voltage charge circuit 28 when it is a series charger, as described subsequently, to connect the external charger 26 to successive individual battery cells in battery 22.

III. Low Voltage to High Voltage Charging Systems

The low to high voltage charger 28 of FIG. 3 can be needed when the battery 22 has a much higher voltage than the external charger 26. Typical hybrid systems used by auto manufacturers include a battery 22 ranging from approximately 50 volts to over 300 volts. The external charger 26 can provide a significantly lower charge voltage than required to charge the battery 22.

With the external charger 26 being a solar panel, the solar panel will typically provide much less voltage than battery 22 used to drive an electric motor 20. Typical solar systems currently available include solar cells of approximately 0.5 volts and a few milliamps per 1 cm square cell. The solar cells are connected in series so that the voltages are added together to form a 6 to 12 volt system, or possibly a larger voltage if space is available where solar cells are placed. With conventional solar cells occupying only a small area available on a vehicle, such as in a moon roof or even the entire roof of a vehicle, the panel may not provide even 50 volts.

With the external charger 26 being a plug in charger, the voltage provided from an AC wall plug will typically be 115 volts. For a battery 22 having a higher voltage than 115 volts, the wall plug in will need to be converted to a higher voltage using a low to high voltage converter 28. Even with a lower voltage battery 22, an AC wall plug in conversion will typically be required to convert from AC to DC to allow charging. Converting from AC to DC can reduce the charge voltage below the 115 volt wall outlet level that may be needed for charging battery 22.

In some embodiments of the present invention, the low voltage to high voltage charge circuit 28 can be a DC-DC converter to take the low voltage (marked 6-12 volts in figures for illustration as a non-limiting example) from the external charger 26, and convert to a high voltage (marked 200-300+ volts in figures for illustration also as a non-limiting example) for charging the vehicle battery 22. In other embodiments, the low voltage to high voltage charge circuit 28 can be a series charger, as described to follow, so that the low voltage external charger 26 is connected individually to each low voltage series cell in the battery to enable battery charging.

A. DC-DC Converter Charging System

Figure 4:
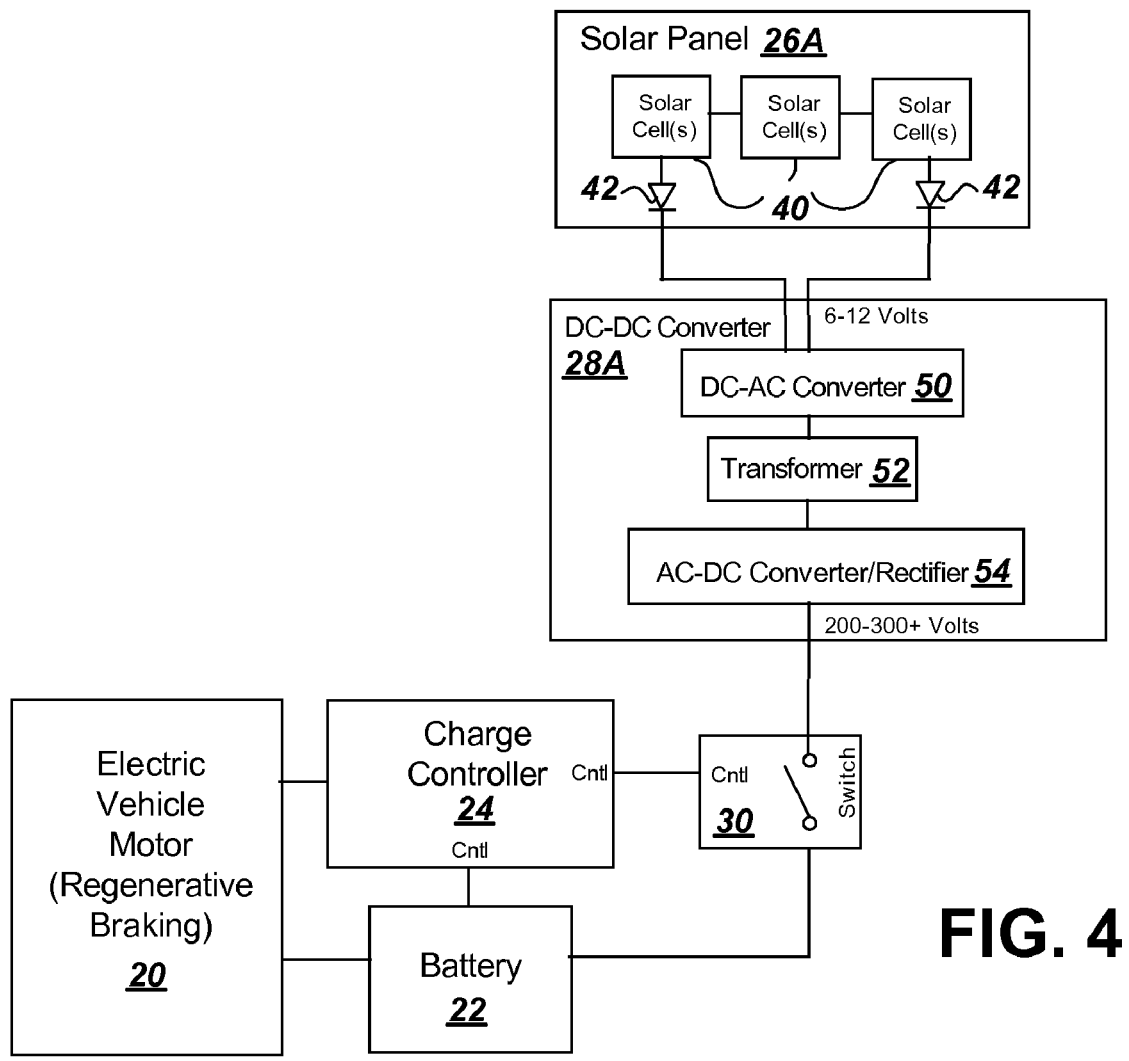
FIG. 4 illustrates components of a battery charging system using a solar panel as an external charger, and a DC-DC converter as a low voltage to high voltage charge circuit.

FIG. 4 illustrates components of a battery charging system using a solar panel 26A as an external charger, and a DC-DC converter 28A as a low voltage to high voltage charge circuit. The solar charging system includes a solar panel 26A that includes several series connected solar cells 40. Diodes 42 provide buffering in the solar panel to prevent reverse current from flowing through the solar cells 40. Other components can be included with the solar panel, such as a charge controller to assure a stable output voltage and current which are not shown.

The DC-DC converter 28A can contain the minimal components shown including: (1) a DC to AC converter or inverter 50, (2) a transformer 52, and (3) an AC to DC converter or rectifier 54. The DC to AC converter 50 serves to convert the low voltage output of the external charger 26A to an AC signal. The transformer 52 boosts the AC voltage to a higher AC voltage than the battery 52 as necessary to charge the battery 22, and the rectifier 54 converts the high voltage AC to DC to enable charging of the battery 22. Since the regenerative braking charging system between the electric motor 20 and battery 22 will typically use a similar rectifier to rectifier 54, in one embodiment a common rectifier can be used to reduce overall circuitry. Other alternative components known in the art can be used in the DC-DC converter 28A.

Although a solar panel 26A is shown as an external charger, the solar panel is used for purposes of illustration in FIG. 4. It is understood that other components such as a plug in charger can similarly be used as an external charger that is connected to a DC-DC converter 28A. Other components that are carried over from FIG. 4 are similarly labeled in FIG. 3, as will be components carried over in subsequent drawings.

Figure 5:
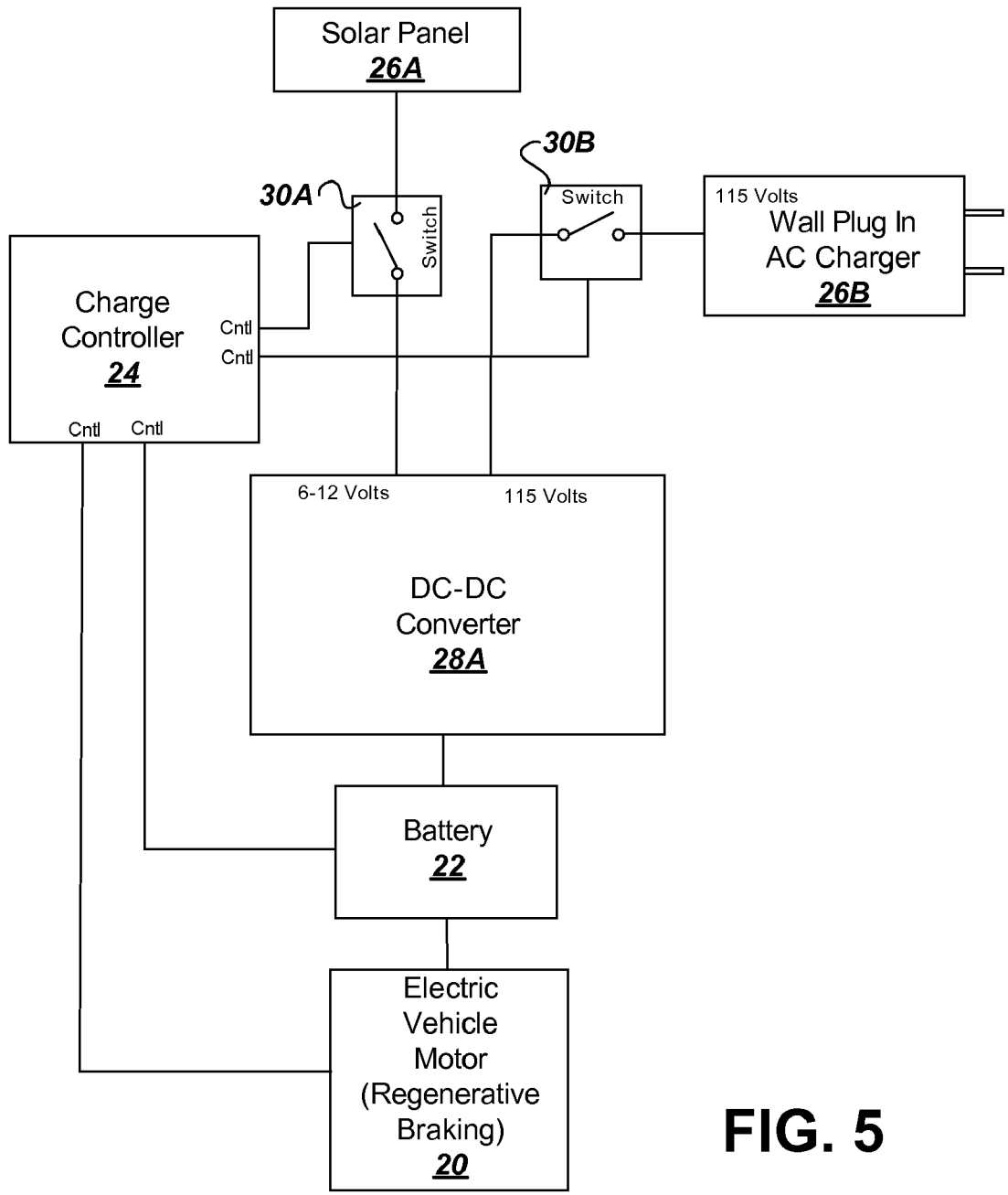
FIG. 5 illustrates how a combined external charging system can be provided and used in combination with a DC-DC converter.

FIG. 5 illustrates how a combined external charging system can be provided and used in combination with a DC-DC converter 28A. In particular, FIG. 5 illustrates use of an AC plug in connection 26B to a 115 volt or 220 volt 60 Hz, or other AC plug in connection in combination with a solar panel 26A. Assuming the battery 22 has a higher voltage than the 115 volt or even the 220 volt AC wall outlet, the plug in charger 26B shown can attach along with the solar panel external charger 26A to the DC-DC converter 28A forming a low voltage to high voltage converter. The solar panel 26A and the plug in connection 26B can share some or all components of the DC-DC converter 28A.

With the low voltage to high voltage charging system 28A being a DC-DC converter, a transformer (52 of FIG. 4) in the DC-DC converter can be used in common to boost voltage for both the solar panel 26A and the AC plug in connection 26B. If the AC wall plug in 26B has an output voltage higher than the DC-AC converter (50 of FIG. 4) connected to the solar panel 26A, stepped transformers can be used to boost the lower voltage from the solar panel 26A in the first step so that voltages from the first transformer and the DC-AC converter match, and then a common second transformer can boost the voltages together. Thus, the plug in charger 26B can be connected for charging and efficiently use components in combination with the solar charging system. In one embodiment, however, separate components are used, particularly if different transformers are desired for the plug in charger 26B and the solar panel charger 26A.

B. Series Battery Charger Systems

Figure 6:
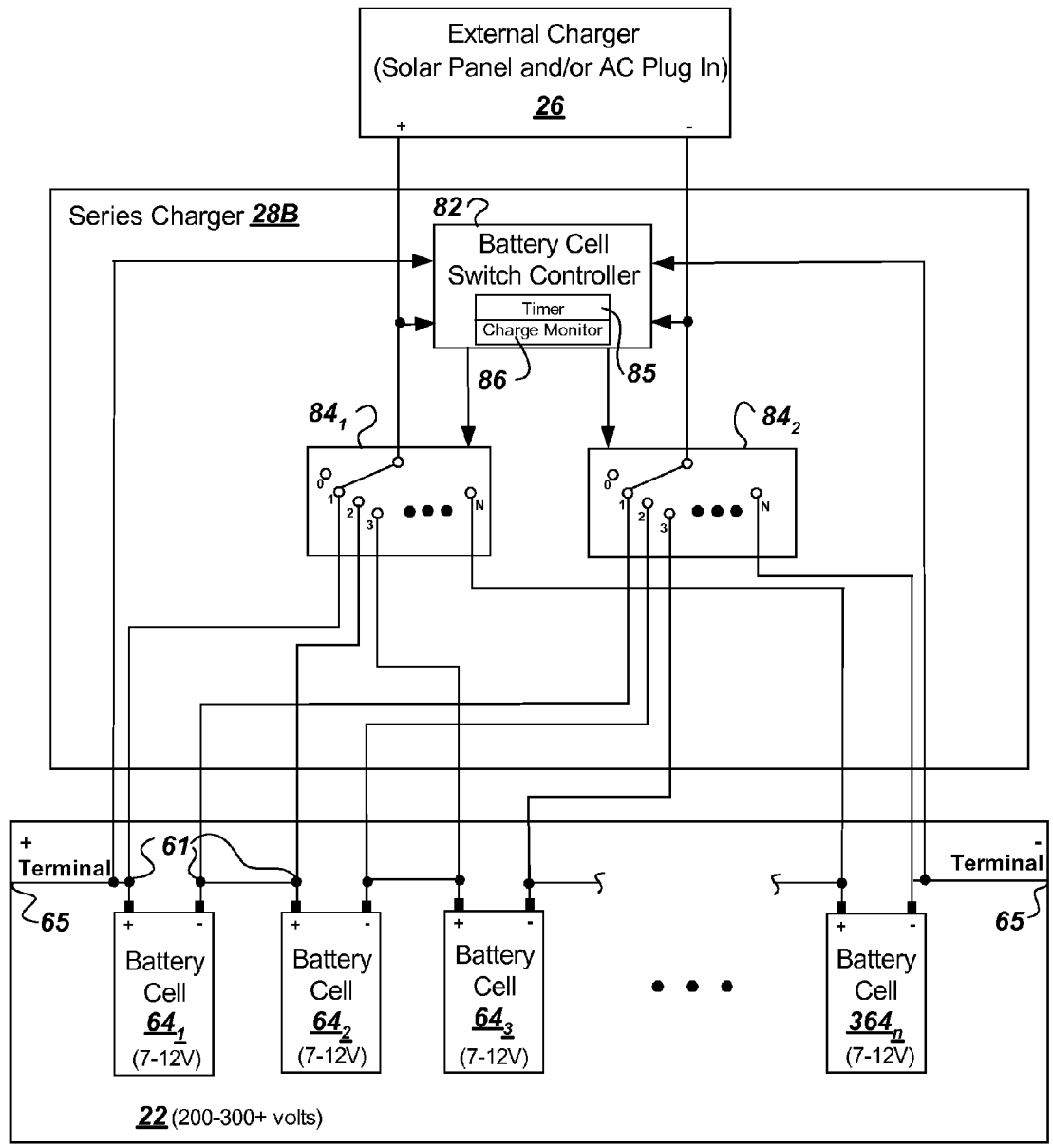
FIG. 6 illustrates a series battery charger that provides an alternative to the DC-DC converter of FIG. 5 for the low voltage to high voltage charging circuit.

FIG. 6 illustrates a series battery charger 28B that provides an alternative to the DC-DC converter 28A of FIG. 5 for the low voltage to high voltage charging circuit. The series battery charger 28B provides an alternative to the less efficient DC-DC converter used in prior art solar charging systems. The DC-DC converter typically will experience less than 80% of the efficiency of a series charger 80 due to the loss through the DC-AC converter and transformer of the DC-DC converter.

The series charger 28B serves to charge a high voltage battery pack 22 (200-300+ volts) made up of series connected battery cells $64_{1-n}$. The series charger can be used to connect to terminals 61 of the individual battery cells $64_{1-6}$ for charging. The individual battery cells $64_{1-n}$ can in one non-limiting example be approximately 10 volts each with thirty connected in series to create 300 volts across the terminals 65 of battery 22. The series charger 60 makes a connection in parallel with the series battery cells $64_{1-n}$, one or more at a time using switches $64_1$ and $64_2$ connected to terminals of the external charger 26. The switches $64_1$ and $64_2$ can be electronic switches, relays, transistors, pass gates, tri-state buffers, or other components known in the art used to accomplish switching.

In operation, during charging by the series charger 26B, the external charger 26 can be connected in parallel across the series connected battery cells $64_{1-n}$ one at a time by moving the position of switches $84_1$ and $84_2$ from position 1, 2, 3 etc. across the battery cells $64_{1-n}$ without any DC-DC conversion. As an alternative to connecting the external charger 26 across one of the battery cells, the switches $84_1$ and $84_2$ can connect across multiple ones of the battery cells $64_{1-n}$, for example by connecting switch $84_1$ to position 1, while switch $84_2$ is connected at position 2. Although not specifically shown, it is noted that each of the cells $64_{1-n}$ can each include a number of series connected cells.

The series charger 28B further includes an individual battery cell switch controller 82. The cell switch controller 82 shown includes components to regulate charging of the individual series battery cells $64_{1-n}$. The cell switch controller 82 can monitor charge on a battery cell being charged using a cell charge monitor 86 and control switches $84_1$ and $84_2$ to charge another one of the battery cells when sufficient charging has occurred. In this manner cell balancing can be provided using the solar panel to assure each battery cell has substantially the same voltage during charging. This can prevent overcharging of some batteries that charge at a faster rate. In one embodiment, a current sink can be provided to drain power from battery cells for the purpose of providing cell balancing in conjunction with the solar cell, and to enable charging and discharging of cells for cell conditioning needed with some types of batteries. Although a solar panel can be used for cell balancing, in one embodiment a separate cell balancer that uses current from one battery cell to balance its voltage with another battery cell can be used. The separate cell balancer may be particularly used if the solar panel is used to charge groups of batteries connected in series at a time, as individual batteries in each group can remain unbalanced.

The cell charge controller 82 can include a timer 85 and switch from battery cell to battery cell on a timed basis to perform charging. Because cells may charge at different rates, less charge time can be set for cells that charge faster to provide for cell balancing. Cell voltage can be monitored and charging controlled to assure cells are charged to a desired voltage due to different charge rates between batteries.

Once all of the cells $64_{1-n}$ are sufficiently charged, as determined by the controller 82 monitoring the terminals 65 of the entire battery 22, the cell switch controller 82 can move the switches $84_1$ and $84_2$ to the open circuit switch position 0 to prevent overcharging of the battery 22. In one embodiment, the cell switch controller 82 can determine the total voltage produced by the solar panel 50, potentially based a charge regulator output, and adjust the number of the cells $64_{1-n}$ being charged at one time based on the voltage produced from external charger 28B.

Figure 7:
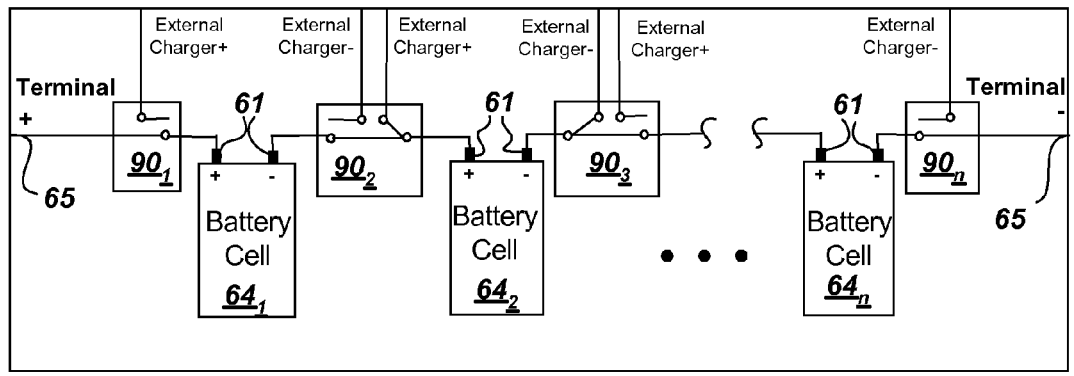
FIGS. 7-8 show alternatives to the configuration of switches of FIG. 6 for a series battery charger.

FIG. 7 shows an alternative to the configuration of switches $84_1$ and $84_2$ of FIG. 6 for a series battery charger. Instead of the two single pole multiple throw switches $84_1$ and $84_2$, the alternative switches include single pole single throw switches $90_{1-n}$ connected to terminals 31 between each one of the cells $64_{1-n}$. Although the end switches $90_1$ and $90_n$ include a single switch, while the middle switches, such as $90_2$, includes two combined switches, it is understood that the middle switches can each be separated into two single pole single throw switches. The switches $90_{1-n}$ selectively connect terminals 31 of the cells $64_{1-n}$ to terminals of the external charger 26. For purposes of illustration, the cell $64_2$ is shown connected by switches $90_{1-n}$ to the solar panel for charging, while the remaining cells are disconnected. The indications external charger− and external charger+ show connections to specific terminals of the external charger 26. The alternative switches $90_{1-n}$ of FIG. 7 and switches $84_1$ and $84_2$ of FIG. 6 illustrate that different switch configurations can be provided to accomplish the same function of connecting the external charger 28B in parallel across individual ones of the cells $64_{1-n}$, one or more of the cells at a time.

Figure 8:
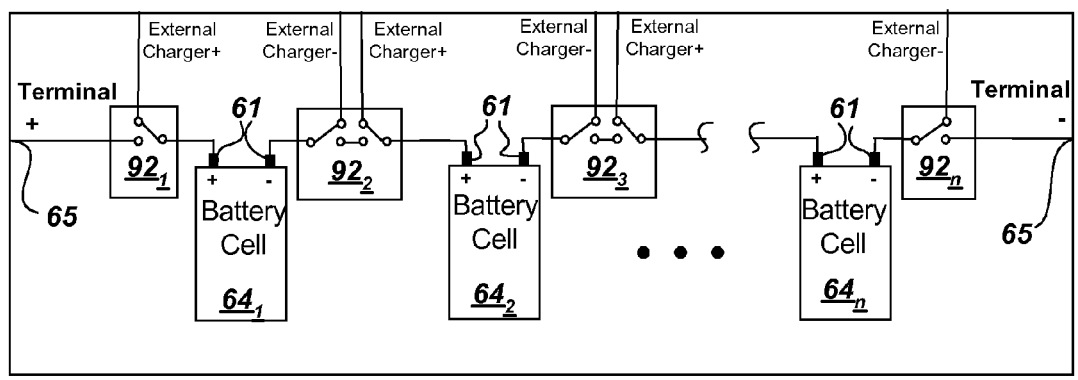

FIG. 8 illustrates an embodiment for a series battery charger wherein connection to the external charger 26 as well as the series connections of individual battery cells $64_{1-n}$ is made using switches $92_{1-n}$. The switches $92_{1-n}$ are single pole double throw switches (although the middle switches, such as $92_2$, are shown as double pole double throw switches they can be separated into two single pole double throw switches.) The switches $92_{1-n}$ illustrate that the series connection between battery cells $34_{1-n}$ can be broken and a single external charger 26 connected by its terminals (external charger+ and external charger−) in parallel across each of the battery cells $64_{1-n}$ to enable charging of all the battery cells $64_{1-n}$ at the same time.

For the series charging systems shown in FIGS. 6-8, the series charger switching systems can be used with different external chargers. For instance the external chargers can be either a solar panel or a plug in system described previously.

IV. Separate Battery Packs

Embodiments of the present invention provide a battery system with an additional battery that is simplified by connecting the additional battery using a current limiter so that excessive charge from regenerative braking or operation of the electric motor does not dictate use of a complex cooling system in the additional battery. The current limiter clamps the current level between batteries to a maximum value to limit heating in the additional battery.

The additional battery allows for storing significantly more charge than can be provided by the original vehicle battery for the electric motor. The additional battery can be connected in parallel to supplement the original vehicle battery, or connected in series to form a battery pack sufficient to run a higher voltage motor. The additional battery can be used to allow for additional charge storage when desired. The additional charge storage may be desirable when charging is provided by an external charge source in addition to regenerative braking which may provide only a limited amount. The additional battery charge storage may also be desirable when there is a weight limit for the vehicle that may not be exceeded with the additional battery some of the time the vehicle is operated. The additional battery charge storage may further be desired when travel is desired over a longer than normal travel distance for the vehicle. Although the term additional battery is used, battery as referenced herein is intended to describe either a rechargeable battery, a capacitor bank, a group of interconnected rechargeable batteries, or other charge storage devices.

Embodiments of the present invention that use an additional battery system are provided based on several recognitions. Initially, it is recognized that both regenerative braking and driving an electric motor require high currents that generate significant heat requiring a complex battery cooling system. Further it is recognized that charging of a battery with either solar power or a plug-in charger will not necessarily generate such heat. Finally based on these recognitions, it is further recognized that an additional battery structure without a complex cooling system can be used with the additional battery connected in parallel with the first battery if high current for regenerative braking or for powering the electric motor is not provided through the added system battery.

A. Separate Battery Pack with Single Direction Current Limiter

Figure 9:
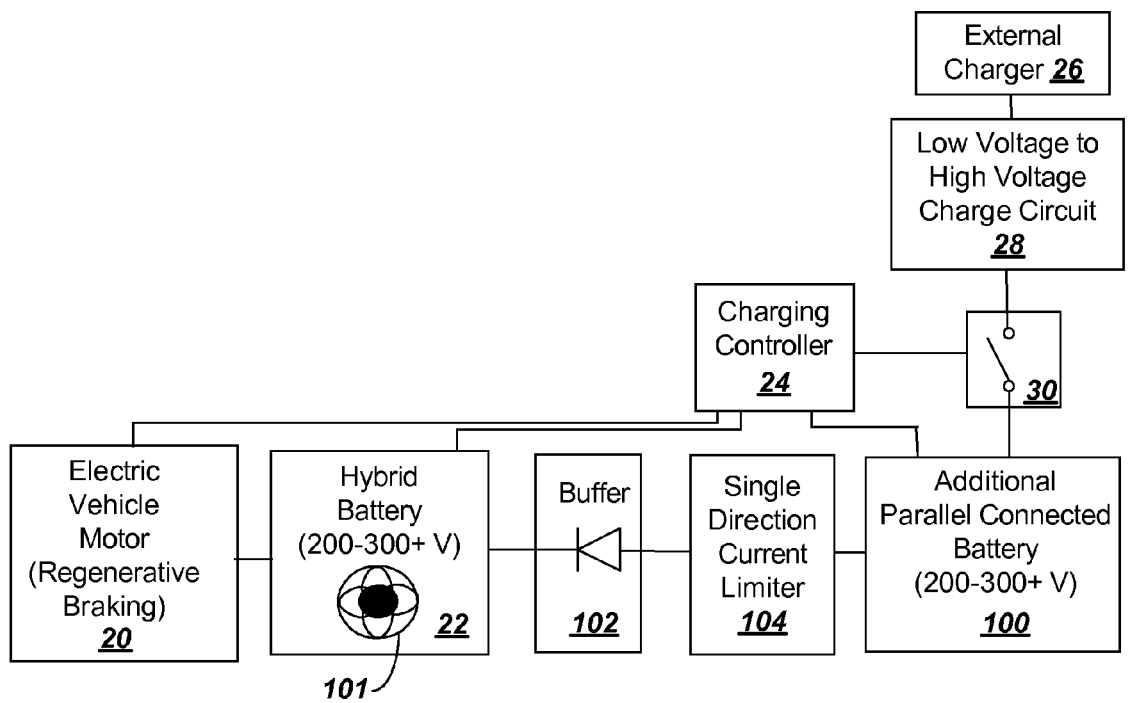
FIG. 9 illustrates components of a first embodiment of a battery charging system for an additional battery connected by a single direction current limiter to a battery charged by regenerative braking.

FIG. 9 illustrates components of a first embodiment of a battery charging system having a separate additional battery 100 connected in parallel with battery 22. In this first embodiment, the additional battery 100 is connected in parallel using a current limiter 104 in combination with a buffer 102. In the system, the additional battery is charged by external charger 26. The external charger 26 connects to the additional battery 100 through the low voltage to high voltage charging circuit 28. The low voltage to high voltage charging circuit 28 can be either a DC-DC converter, as described with respect to FIGS.

4-5, or a series charger such as described with respect to FIGS. 6-8. A charge controller 24 monitors charging of both batteries 22 and 100, operates switch 30 to disconnect the external charger to prevent overcharge of the batteries 22 and 100, and further operates electric motor 20 to control regenerative brake charging of battery 22. With a series charger used for the low to high voltage charging circuit 28, the switch 30 will be internally provided and a separate switch will be unnecessary. The additional battery 100 provides added charge storage so that an electric vehicle can travel farther on a full charge.

An added feature in FIG. 9 is that the additional battery 100 can be a lower cost device than battery 22, since the additional battery 100 will not require a cooling system (illustrated by fan 101) to prevent the high regenerative braking charge current from causing overheating if buffer 102 separates the batteries 100 and 22. The regenerative braking charged battery 22 will typically have a cooling system with fans 101 or other components that will be unnecessary with the low current solar charging system. The buffering 102 allows only the external charger 26 to charge the additional battery 100, since a regenerative braking charging current will be blocked by buffer 102 from the additional battery 100. The external charger 24, however, can provide current through buffer 102 to charge both batteries 22 and 100. If regenerative brake charging is desired for both batteries 100 and 22, buffering 102 can be removed between the two batteries 22 and 100.

To prevent high current from being drawn from both batteries 22 and 100 to run the electric motor 20, the system of FIG. 9 further includes a current limiter 104. The current limiter 104 clamps the current running from battery 100 to the battery 22 to a maximum value that will limit heat generation in battery 100. Current will still flow from additional battery 100 to enable charge of the battery 22, and to enable driving the motor 20 using current from the additional battery. The current limiter 104 will, thus, allow the additional battery 100 and the external charger 24 to assist in driving the electric motor of the vehicle without overheating due to $I^2R$ losses though the battery 100. With the external charger 24 being a series charger, the current limiter 104 enables charging the additional battery 100 one cell at a time using the series charger 24, while effectively charging all of the cells of battery 22 together.

Figure 10A:
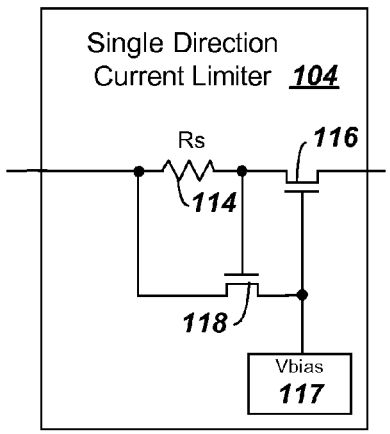
FIGS. 10A-10D show example circuits for the single direction current limiter of FIG. 9.

FIGS. 10A-10D show example circuitry for the single direction current limiter 104 of FIG. 9. FIG. 10A illustrates the use of CMOS transistors to form the current limiter 104 that clamps the current running from additional battery 104 to battery 22 to a maximum desired value. The current is clamped, but will not significantly limit current when lower voltage differences are placed across the batteries 22 and 100. The current limiter 104 of FIG. 10A includes a sense resistor 114 to both sense the current between the batteries 22 and 100, and to set a value for the maximum current between the batteries 22 and 100. Transistors 116 and 118 and Vbias circuit 117 form a clamp to limit current when voltage from battery 100 is significantly higher than battery 22.

The NMOS transistor 116 is connected with a source-drain path between batteries 22 and 100. The transistor 118 has a gate-source path connected across the sense resistor 114, and a drain connected to the gate of the transistor 116. The transistors 116 and 118 are shown as NMOS devices that will carry current from source to drain with a high gate voltage, but will begin to turn off when their gate voltage goes low. The Vbias circuit 117 provides a bias voltage to hold the gate of transistor 116 high and turn it on until transistor 118 turns on sufficiently. Thus, with little or no voltage difference between the batteries 22 and 100, the Vbias circuit 117 will provide a high to turn on transistor 116. The gate of transistors 118 will be low, and it will be off to prevent any voltage drop on the gate of transistor 118. As the difference between batteries 22 and 100 increases, the NMOS transistor 118 will start to turn on and will decrease the gate voltage on transistor 116 to start to turn it off. The voltage of the standard NMOS gate-source threshold (usually approximately 0.7 volts) divided by the resistance Rs of the sense resistor 114 will set the clamp current. Thus, Rs can be chosen depending on the desired maximum current.

The Vbias circuit 117 can be powered using battery 100. Thus, with the battery 100 discharged, the current limiter circuit 104 will not function, and transistor 116 will remain off to prevent any current drain until battery 100 is charged sufficiently. Current drained through transistor 118 from Vbias circuit 117 will drain into battery 22, so a constant current loss will not occur in the system.

Figure 10B:
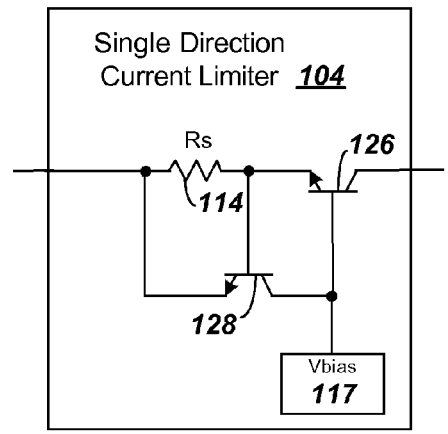
Figure 10C:
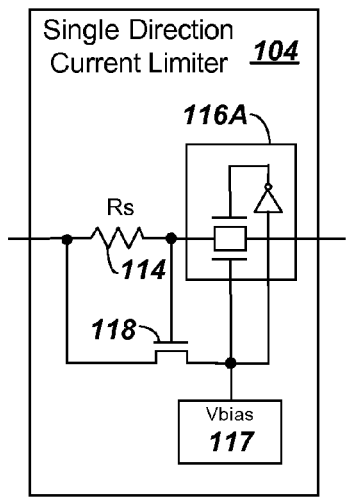

FIG. 10B illustrates a current limiter circuit 104 showing how BJT transistors can be utilized in place of the CMOS devices of FIG. 10A. The circuit of FIG. 10B replaces the CMOS transistors 116 and 118 with respective BJT devices 126 and 128. Although FIG. 10A shows NMOS transistors and FIG. 10B show NPN type transistors, it is understood that PMOS or PNP type transistors can be used instead. FIG. 10C shows that the NMOS transistor 116 of FIG. 10A can further be replaced with respective pass gate 116A. Further, although not shown it is contemplated that other transistor types, such as FET devices can similarly be used in a current limiter circuit.

Figure 10D:
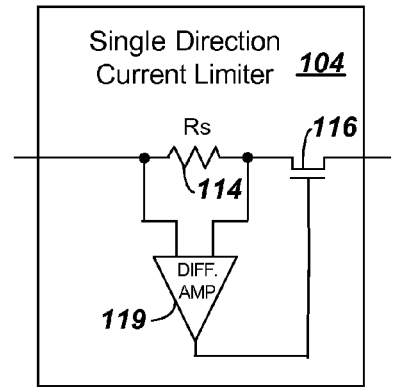

FIG. 10D illustrates the use of a differential amplifier 119 to create the current limiter 104 that clamps the current to a maximum desired value. As with the current limiter of FIG. 10A that uses NMOS type transistors in the path between batteries 22 and 100, the circuit of FIG. 10D similarly uses an NMOS transistor 116. Although shown as NMOS transistor 116, as indicated above other transistor types such as a PMOS devices, BJT transistors or FET transistors can be used. The differential amplifier 119 includes components that maintain the gate voltage on transistor 116 high and then provide a decreasing voltage dependant upon current measured by the difference between voltages across input terminals of sensing resistor 114. The output of the differential amplifier 119 then will be lowered on the gate of transistor 116 to limit or clamp current flow to a desired maximum value between batteries 22 and 100.

B. Separate Battery Pack with Bi-Directional Current Limiter

Figure 11:
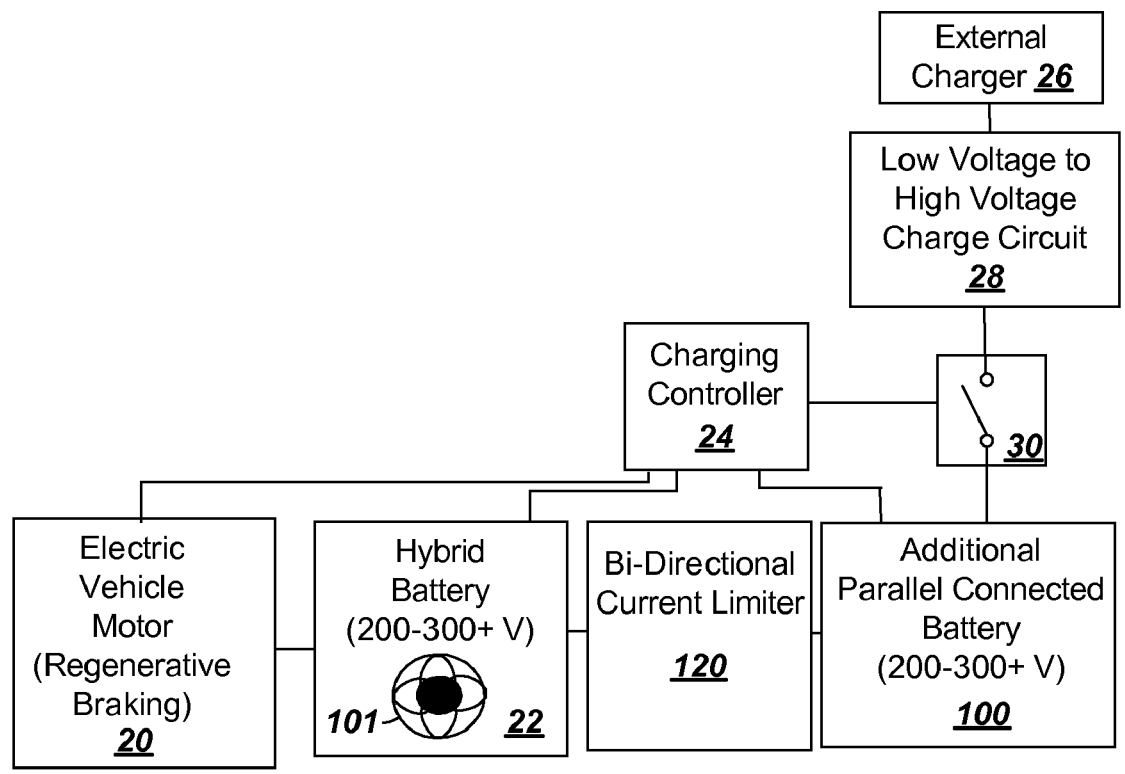
FIG. 11 shows modifications to FIG. 9 to allow current clamping in two directions by a bi-directional current limiter.

FIG. 11 shows modifications to FIG. 9 to allow current clamping in two directions using a bi-directional current limiter 120. In FIG. 11, the diode buffer 102 of FIG. 9 is eliminated and replaced by the bi-directional current limiter 120 since the current limiter 120 will now provide protection from high current due to regenerative braking from electric motor 20. The current limiter 120 will further provide protection from high current should additional battery 100 be connected to battery 22 when battery 22 has a significantly higher charge. The bidirectional current limiter 120 clamps current to a maximum value in both directions to prevent overheating of the additional battery 100.

A combined diode buffer 102 and one directional current limiter of FIG. 9 can, however, be desirable when it is undesirable to charge the second battery 100 by regenerative braking at all in a design. The undesirability of charging second battery 100 can result when the limited regenerative braking charging only supplies enough current to charge the battery 22 above a desired voltage, while if both batteries 100 and 22 are charged from regenerative braking the combined charged voltage may be insufficient to operate the motor 20.

The benefits of the bi-directional current buffer of FIG. 11, however, may be desirable for some designs. As opposed to the diode buffer 102 of FIG. 9, the bidirectional current limiter 120 of FIG. 11 allows the additional battery 100 to assist in providing additional charge to drive the electric motor 20 of the vehicle without overheating due to I²R losses though the battery. Further, as opposed to the diode buffer 102 of FIG. 9, the bi-directional current limiter 120 will allow the additional battery 100 to be charged by regenerative braking without overheating.

A beneficial feature of the system of either FIG. 9 or FIG. 11 is provided when the low to high voltage charging circuit 28 is a series charger. First, if the battery 22 is not easily accessible to install a switching circuit for the series charger, the series charger can still be easily connected in the added battery 100. Further, with the battery 100 and battery 22 connected in parallel, the series charger can charge an individual cell of battery 22 and as a consequence will provide current to charge all of the series cells of battery 22. With both batteries 22 and 100 connected, and battery 100 charged to the voltage of battery 22, the voltages will equalize when the additional battery 100 is further charged to effectively charge the battery 22. The battery 22 can, thus, be charged by a lower voltage external charger 26 without requiring series charging of its individual cells or without requiring DC-DC conversion.

Figure 12A:
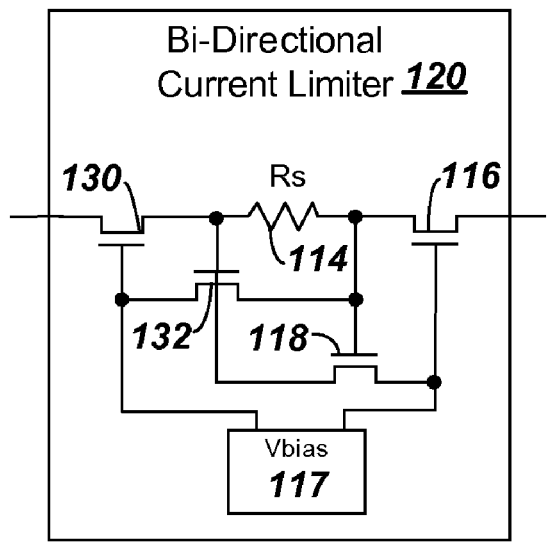
FIGS. 12A-12B show example circuits for the bi-directional current limiter of FIG. 11.
Figure 12B:
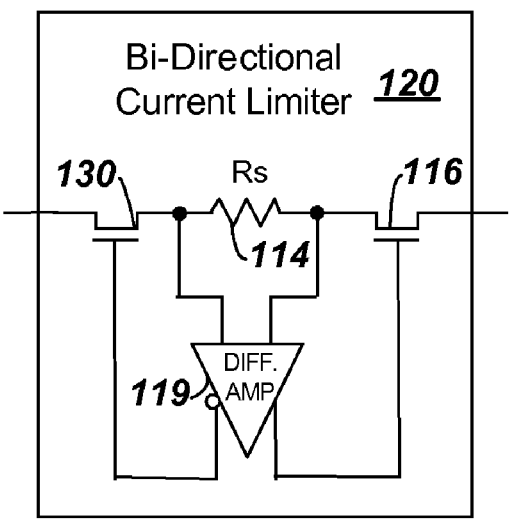

FIGS. 12A-B illustrate exemplary circuit embodiments for the bidirectional current limiter 120 of FIG. 10. FIG. 12A shows a first circuit for providing a bidirectional current buffer 120. The circuit of FIG. 12A includes the components of FIG. 10A including transistors 116 and 118 that clamp excess current in the direction from battery 100 to battery 22. The circuit of FIG. 12A adds a set of transistors 130 and 132 that clamp excess current in the direction from battery 22 to battery 100. The current limiter operating in both directions share the sensing resistor 114 and Vbias circuit 117, although separate resistors and bias circuits can be used. Transistors 116 and 118 form a first clamp to limit current when voltage on battery 100 is higher than battery 22. Transistors 116 and 118 operate along with resistor 114 and Vbias circuit 117 as described with respect to FIG. 10A. Transistors 130 and 132 form a second clamp to limit current when voltage on battery 22 is higher than battery 100. Transistor 132 serves to measure current across resistor 114 traveling in an opposite direction than current detected through transistor 118. The transistor 132 then drives the gate of transistor 130 to turn off the transistor 130 as current from battery 22 increases in the direction of battery 100. The Vbias circuit 117 serves to keep the gate of transistor 130 high to turn it on until transistor 132 turns on sufficiently. The transistors 130 and 132 otherwise function similar to the clamping circuit made up of transistors 116 and 118.

FIG. 12B illustrates the use of a differential amplifier 119 to create the bi-directional current limiter 120 that clamps the current to a maximum desired value. The circuit of FIG. 12B is similar to that of FIG. 10D with an additional transistor 130 added that is driven by a complementary output of amplifier 119. The complementary output of the differential amplifier 119 will sustain a high voltage to keep transistor 116 on and then will provide a lowered voltage to the gate of transistor 130 to limit its current flow when battery 100 is significantly lower than battery 22. Similarly, the differential amplifier 119 will sustain a high voltage on the gate of transistor 130 when battery 22 is significantly higher than battery 100 will cause a decrease in voltage to be applied from differential amplifier 119 to the gate of transistor 116. The action of differential amplifier 119 on the gate of transistor 130 will limit current in the direction from battery 22 toward battery 100 to a desired value. The action of differential amplifier 119 on the gate of transistor 116 will continue to limit current in the direction from battery 100 toward battery 22 to a desired value.

For both FIGS. 12A and 12B, in addition to the CMOS transistors shown, other configurations of transistors can be used to create a bi-directional current buffer. As described with respect the circuits of FIGS. 10A-10D, BJT or FET transistors can be used, as well as complementary transistors, such as PMOS, or combinations of transistors to form pass gates.

Although embodiments of the present invention have been described above with particularity, this was merely to teach one of ordinary skill in the art how to make and use the invention. Many additional modifications will fall within the scope of the invention, as that scope is defined by the following claims.

What is claimed is:

1. A battery charging system for a vehicle comprising:
   electric motor configured to draw current to operate as a drive motor for a vehicle and to supply current for regenerative braking;
   a first battery connected to the electric motor;
   a second battery;
   a battery charger connected to the second battery; and
   a current limiting buffer connecting the first battery in parallel with second battery, the current limiting buffer comprising:
     a connecting transistor having a current path connecting the first battery in parallel with the second battery and having a control terminal; and
     a control circuit connected between the first battery and the second battery, and to the control terminal of the connecting transistor, the control circuit for determining a voltage difference between the first and the second batteries, and applying a voltage to the control terminal to control the amount of current flow between the first battery and the second battery.

2. The battery charging system of claim 1, wherein the control circuit comprises:
   a sensing resistor having a first terminal connected to the first battery and having a second terminal connected by a current path of the connecting transistor to the second battery;
   a control transistor having a current path connected from the second terminal of the sensing resistor to the control terminal of the connecting transistor, and having a control terminal connected to the first terminal of the sensing resistor.

3. The battery charging system of claim 2,
   wherein the connecting transistor comprises a CMOS transistor having a source-drain path forming the current path, and a gate forming the control terminal, and
   wherein the control transistor comprises a CMOS transistor having a source-drain path forming the current path, and a gate forming the control terminal.

4. The battery charging system of claim 2,
   wherein the connecting transistor comprises a BJT transistor having a collector-emitter path forming the current path, and a base forming the control terminal, and
   wherein the control transistor comprises a BJT transistor having a collector-emitter path forming the current path, and a base forming the control terminal.

5. The battery charging system of claim 1, wherein the control circuit comprises:
- a sensing resistor having a first terminal connected to the first battery and having a second terminal connected by a current path of the connecting transistor to the second battery; and
- a differential amplifier having a first input connected to the first terminal of the sensing resistor, a second input connected to the second terminal of the sensing resistor, and an output connected to the control terminal of the connecting transistor.

6. The battery charging system of claim 1, further comprising a diode buffer connecting the first battery and the second battery.

7. The battery charging system of claim 1, wherein the current limiting buffer comprises a bi-directional buffer.

8. The battery charging system of claim 7,
wherein the connecting transistor comprises a first connecting transistor, the battery charging system further comprising a second connecting transistor having a current path and a control terminal, and
wherein the control circuit comprises:
- a sensing resistor having a first terminal connected by a current path of the first connecting transistor to the first battery and having a second terminal connected by a current path of the second connecting transistor to the second battery;
- a first control transistor having a current path connected from the second terminal of the sensing resistor to the control terminal of the first connecting transistor, and having a control terminal connected to the first terminal of the sensing resistor; and
- a second control transistor having a current path connected from the first terminal of the sensing resistor to the control terminal of the second connecting transistor, and having a control terminal connected to the second terminal of the sensing resistor.

9. The battery charging system of claim 8, wherein the first and second connecting transistors and the first and second control transistors each comprise at least one of a BJT transistor and a CMOS transistor.

10. The battery charging system of claim 7,
wherein the connecting transistor comprises a first connecting transistor, the battery charging system further comprising a second connecting transistor having a current path and a control terminal, and
wherein the control circuit comprises:
- a sensing resistor having a first terminal connected by a current path of the first connecting transistor to the first battery and having a second terminal connected by a current path of the second connecting transistor to the second battery; and
- a differential amplifier having a first input connected to the first terminal of the sensing resistor, a second input connected to the second terminal of the sensing resistor, a first output connected to the control terminal of the first connecting transistor and a second output complementary to the first output connected to the control terminal of the second connecting transistor.

11. A method for charging a battery charging for a vehicle comprising:
- providing an electric motor configured to draw current to operate as a drive motor for a vehicle and to supply current for regenerative braking;
- providing a first battery connected to the electric motor;
- providing a second battery;
- providing a battery charger connected to the second battery; and
- providing a transistor with a current path connecting the first battery in parallel with the second battery, the transistor having a current control terminal; and
- controlling voltage on the control terminal of the transistor to limit the amount of current flow between the first battery and the second battery.

12. The method of claim 11, wherein the control voltage is applied to the control terminal of the transistor to limit current in both directions between the first battery and the second battery.

13. The method of claim 11, further comprising:
measuring current flow through a resistor connected between the first battery and the second battery and controlling the voltage on the control terminal based on the measured current flow.

14. The method of claim 11, wherein the step of controlling voltage limits current flow by clamping the current flow to a maximum value.

* * * * *